United States Patent
Oka

(10) Patent No.: US 11,971,320 B2
(45) Date of Patent: Apr. 30, 2024

(54) INSPECTION JIG

(71) Applicant: Mitsubishi Electric Corporation, Tokyo (JP)

(72) Inventor: Toshihide Oka, Isahaya (JP)

(73) Assignee: Mitsubishi Electric Corporation, Tokyo (JP)

( * ) Notice: Subject to any disclaimer, the term of this patent is extended or adjusted under 35 U.S.C. 154(b) by 297 days.

(21) Appl. No.: 17/628,163

(22) PCT Filed: Sep. 30, 2019

(86) PCT No.: PCT/JP2019/038500
§ 371 (c)(1),
(2) Date: Jan. 18, 2022

(87) PCT Pub. No.: WO2021/064788
PCT Pub. Date: Apr. 8, 2021

(65) Prior Publication Data
US 2022/0316980 A1 Oct. 6, 2022

(51) Int. Cl.
*G01M 11/00* (2006.01)
(52) U.S. Cl.
CPC .................................. *G01M 11/00* (2013.01)
(58) Field of Classification Search
CPC .................................................... G01M 11/00
See application file for complete search history.

(56) References Cited

U.S. PATENT DOCUMENTS

| 6,147,505 A | 11/2000 | Ott et al. | |
|---|---|---|---|
| 2005/0156313 A1* | 7/2005 | Hashimoto | G01R 1/0416 257/737 |
| 2018/0275167 A1 | 9/2018 | Nagata | |

FOREIGN PATENT DOCUMENTS

| JP | S53-118055 U | 9/1978 |
|---|---|---|
| JP | S59-097482 U | 7/1984 |

(Continued)

OTHER PUBLICATIONS

An Office Action; "Decision of Refusal," mailed by the Japanese Patent Office dated May 30, 2023, which corresponds to Japanese Patent Application No. 2021-550748 and is related to U.S. Appl. No. 17/628,163; with English language translation.

(Continued)

*Primary Examiner* — Jamil Ahmed
(74) *Attorney, Agent, or Firm* — Studebaker & Brackett PC

(57) ABSTRACT

An inspection jig is used for inspection for an inspection target device including a flexible substrate having a flexible base material with external connection terminals formed thereon. The inspection jig is composed of an inspection device and an attraction part. The inspection device has inspection terminals, and the inspection terminals have vacuum attraction holes. The attraction part has an attraction surface. The external connection terminals have first through holes. In inspection, the attraction part is placed on the front surface of the flexible base material so that the first through holes and the vacuum attraction holes overlap each other and the attraction surface covers the first through holes, and the insides of the first through holes and the vacuum attraction holes are made into vacuum, whereby the attraction surface is attracted to the flexible base material and the external connection terminals are attracted to the inspection terminals.

13 Claims, 14 Drawing Sheets

(56) References Cited

FOREIGN PATENT DOCUMENTS

| | | |
|---|---|---|
| JP | S60-008882 U | 1/1985 |
| JP | H05-175633 A | 7/1993 |
| JP | H10-232260 A | 9/1998 |
| JP | 2004-071890 A | 3/2004 |
| JP | 2008-135209 A | 6/2008 |
| JP | 2011-228383 A | 11/2011 |
| JP | 2017-067662 A | 4/2017 |

OTHER PUBLICATIONS

"Notice of Reasons for Refusal" Office Action issued in JP 2021-550748; mailed by the Japanese Patent Office dated Aug. 30, 2022.
International Search Report issued in PCT/JP2019/038500; dated Dec. 3, 2019.

* cited by examiner

INSPECTION JIG

TECHNICAL FIELD

The present invention relates to an inspection jig used for inspection for an inspection target device having a flexible substrate for external connection.

BACKGROUND ART

An example of an inspection target device having a flexible substrate for external connection is an optical module for communication using an optical fiber network. In general, such a flexible substrate provided to an optical module has terminals with fine conductor patterns (see, for example, Patent Document 1).

In inspecting the inspection target device, an inspection jig composed of an inspection device and a holding part has been conventionally used. At the time of inspecting the inspection target device, the positions of a terminal of the flexible substrate and a terminal of the inspection device are aligned with each other, and the flexible substrate is pressed toward the inspection device by the holding part, thereby bringing the terminals into close contact with each other and thus establishing electric connection between the terminals.

CITATION LIST

Patent Document

Patent Document 1: Japanese Laid-Open Patent Publication No. 2004-071890

SUMMARY OF THE INVENTION

Problems to be Solved by the Invention

In a case of using the inspection jig described above, position alignment between the terminal of the flexible substrate and the terminal of the inspection device sometimes fails. In addition, when the holding part is pressed, the terminals might be displaced from each other, so that position alignment might fail.

When position alignment has failed, electric connection between the terminals is lost or becomes insufficient. Therefore, it is desired that whether or not position alignment has succeeded can be determined. If electric characteristics of the inspection target device are measured in a state in which there is a problem with electric connection between the terminals, an erroneous measurement result is obtained. If failure in the position alignment is not recognized, a problem that, for example, a non-defective product is determined to be a defective product because of the erroneous measurement result, occurs. If failure in the position alignment can be determined before measurement of electric characteristics, such a problem can be avoided, and therefore it is desired that whether or not the position alignment has succeeded can be determined.

However, it has been conventionally difficult to determine whether or not position alignment has succeeded. Even if confirmation is attempted visually or by a camera for the purpose of the determination, the holding part is present as an obstacle and thus it is impossible to view or take an image of the overlapping state of the terminals.

The present invention has been made to solve the above problem, and an object of the present invention is to provide an inspection jig that, in inspecting an inspection target device having a flexible substrate for external connection, makes it possible to easily determine whether or not position alignment between terminals of the flexible substrate and an inspection device has succeeded.

Solution to the Problems

An inspection jig according to the present invention is an inspection jig used for inspection for an inspection target device including a flexible substrate having a flexible base material and an external connection terminal formed on a back surface of the flexible base material, the inspection jig including: an inspection device having an inspection base and an inspection terminal formed on the inspection base; and an attraction part having an attraction surface. The external connection terminal has a first through hole penetrating therein and also through the flexible base material. The inspection terminal has a vacuum attraction hole at a position corresponding to the first through hole of the flexible substrate to be placed in the inspection. In the inspection, the inspection target device is placed so that the external connection terminal and the inspection terminal are face-to-face with each other and the first through hole and the vacuum attraction hole overlap each other, the attraction part is placed on a front surface of the flexible base material so that the attraction surface covers the first through hole, and insides of the first through hole and the vacuum attraction hole are made into vacuum, whereby the attraction surface is attracted to the flexible base material and the external connection terminal is attracted to the inspection terminal.

Effect of the Invention

In the inspection jig according to the present invention, at the time of inspecting the inspection target device having the flexible substrate for external connection, the attraction part is vacuum-attracted through the through hole formed in the terminal of the flexible substrate and the vacuum attraction hole formed in the terminal of the inspection device. Therefore, merely by applying a force to the attraction part to confirm whether or not the attraction part moves, it is possible to easily determine whether or not position alignment between the terminals of the flexible substrate and the inspection device has succeeded.

DESCRIPTION OF EMBODIMENTS

Embodiment 1

(Structure)

Figure 1:
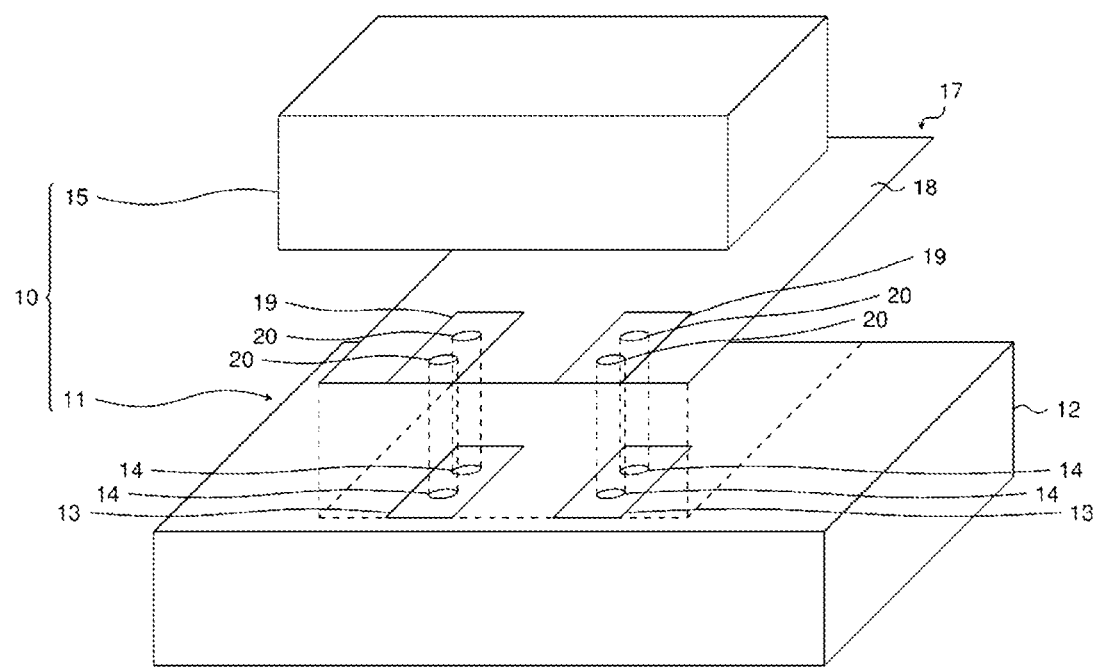
FIG. 1 is a perspective view showing an inspection jig and a flexible substrate according to embodiment 1.
Figure 2A:
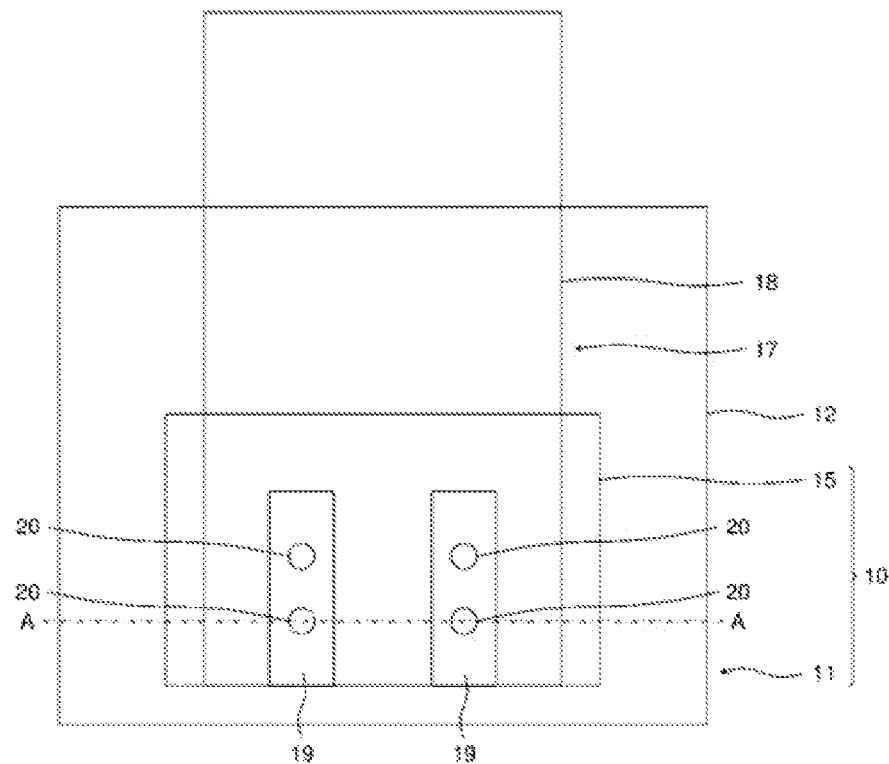
FIG. 2A is a top view showing the inspection jig and the flexible substrate according to embodiment 1.
Figure 2B:
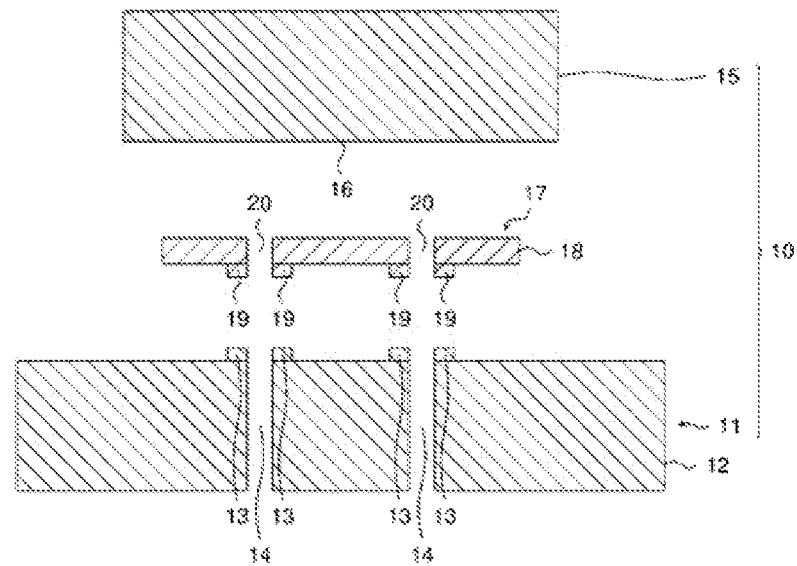
FIG. 2B is a sectional view showing the inspection jig and the flexible substrate according to embodiment 1.

The structure of an inspection jig according to embodiment 1 of the present invention will be described. The inspection jig is used for inspecting an inspection target device, and here, the inspection target device is an optical module having a flexible substrate for external connection. FIG. 1 shows an inspection jig 10 and a flexible substrate 17 according to embodiment 1. FIG. 2A is a view as seen from above in FIG. 1, and FIG. 2B is a sectional view along line A-A in FIG. 2A. In FIG. 2A, members are shown transparently for convenience of description.

The inspection jig 10 includes an inspection device 11 and an attraction part 15. The inspection device 11 includes an inspection base 12. The inspection base 12 has inspection terminals 13 on the front surface thereof. The shapes of the inspection terminals 13 as seen from above are the same as the shape of external connection terminals 19 of the flexible substrate 17. The inspection terminals 13 are electrically connected to a measurement device (not shown) through wires (not shown).

At the inspection terminals 13, vacuum attraction holes 14 are formed. The vacuum attraction holes 14 are formed at positions corresponding to first through holes 20 of the flexible substrate 17. In inspection, when the flexible substrate 17 is placed, the vacuum attraction holes 14 and the first through holes 20 overlap each other. Each vacuum attraction hole 14 is opened at an end on the inspection terminal 13 side, and is connected to a vacuum suction device (not shown) on the other end side. Each inspection terminal 13 has some thickness, but in FIG. 1, the thickness is not shown. In FIG. 2A, the inspection terminals 13 and the vacuum attraction holes 14 are overlapped with the external connection terminals 19 and the first through holes 20 of the flexible substrate 17, and therefore the reference characters thereof are not shown.

The attraction part 15 has an attraction surface 16 to be attracted to the flexible base material 18. It is desirable that the attraction surface 16 is made of a soft material such as an elastic material so as not to cause damage, e.g., deformation on the flexible base material 18. The attraction surface 16 may have any shape that covers all the first through holes 20 corresponding to the vacuum attraction holes 14.

The flexible substrate 17 has the flexible base material 18. One end of the flexible substrate 17 is connected to a main body of an optical module (not shown). At another end of the flexible substrate 17, the external connection terminals 19 to be connected to the outside are formed on the back surface of the flexible base material 18. The external connection terminals 19 are electrically connected to the main body of the optical module through wires (not shown). Although the flexible base materials 18 and the external connection terminals 19 both have some thicknesses, the thicknesses are not shown in FIG. 1.

At the external connection terminals 19, first through holes 20 are formed. The first through holes penetrate also through the flexible base material 18.

(Inspection Method)

Figure 3A:
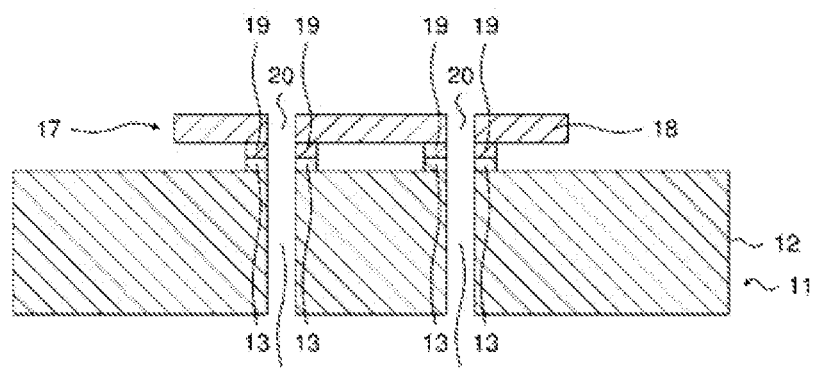
FIG. 3A is a sectional view illustrating an inspection method using the inspection jig according to embodiment 1.

An inspection method for the optical module having the flexible substrate 17 for external connection will be described with reference to FIG. 3A, FIG. 3B and FIG. 3C. First, the optical module is placed, so that, as shown in FIG. 3A, the inspection terminals 13 of the inspection device 11 and the external connection terminals 19 of the flexible substrate 17 come into face-to-face contact with each other and the first through holes 20 and the vacuum attraction holes 14 overlap each other.

Figure 3B:
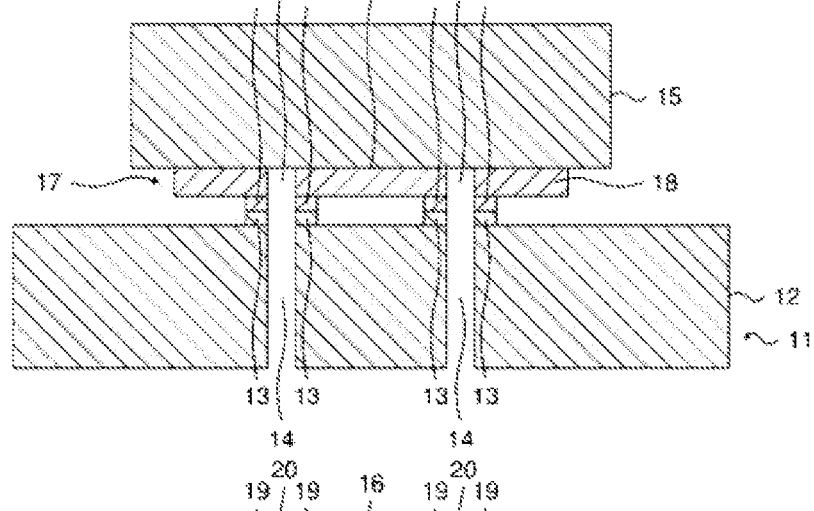
FIG. 3B is a sectional view illustrating an inspection method using the inspection jig according to embodiment 1.

Next, as shown in FIG. 3B, the attraction part 15 is placed on the front surface of the flexible base material 18. At this time, the attraction part 15 is placed so that the attraction surface 16 covers the first through holes 20.

Figure 3C:
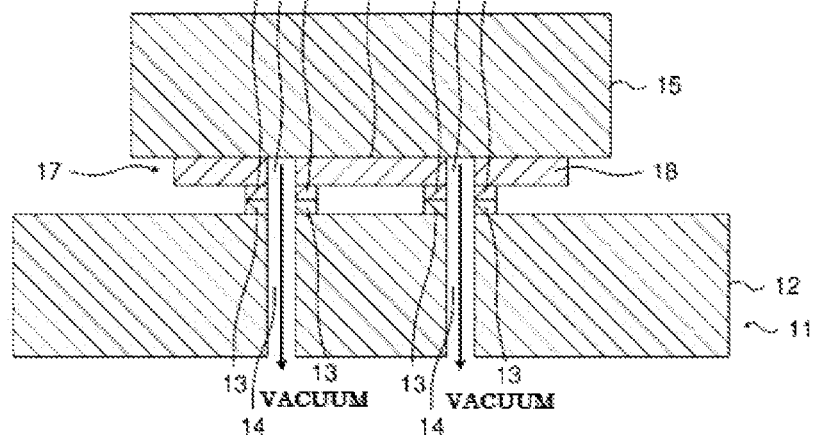
FIG. 3C is a sectional view illustrating an inspection method using the inspection jig according to embodiment 1.

Next, a vacuum suction device is actuated to make the insides of the vacuum attraction holes 14 and the first through holes 20 into vacuum as shown in FIG. 3C, thereby attracting the attraction surface 16 to the flexible base material 18. At the same time, the external connection terminals 19 are attracted to the inspection terminals 13, whereby electric connection therebetween is assuredly obtained.

Next, whether or not the attraction part 15 is attracted is confirmed. For this purpose, the attraction part 15 may be pressed by an appropriate force in the horizontal direction or may be pulled upward. Even when a force is applied in this way, the attraction part 15 does not move because the attraction part 15 is attracted.

Next, electric characteristics of the optical module are measured using the measurement device.

Next, the vacuum attraction is stopped and the attraction part 15 and the flexible substrate 17 are detached from each other.

Thus far, a case where position alignment between the inspection terminals 13 and the external connection terminals 19 has succeeded has been described. Hereinafter, a case where position alignment has failed will be described.

In the case where position alignment has failed, the vacuum attraction holes 14 and the first through holes 20 do not properly overlap each other. When the inspection terminals 13 and the external connection terminals 19 are misaligned, the vacuum attraction holes 14 and the first through holes 20 do not overlap at all or only parts of them overlap each other.

When the vacuum attraction holes 14 and the first through holes 20 do not properly overlap each other, the attraction force of the attraction part 15 is weakened. If the vacuum attraction holes 14 and the first through holes 20 do not overlap at all, the insides of the first through holes 20 are not made into vacuum, so that the attraction part 15 is not attracted. If only parts of both holes overlap each other, the attraction force of the attraction part 15 is weakened.

If the attraction force of the attraction part 15 is excessively weak, the attraction part 15 moves when a force is applied to confirm whether or not the attraction part 15 is attracted. Thus, failure of position alignment can be determined.

(Effects)

As described above, according to embodiment 1, in inspection, merely by applying a force to the attraction part 15 to confirm whether or not the attraction part 15 moves, it is possible to determine whether or not position alignment between the external connection terminals 19 of the flexible substrate 17 and the inspection terminals 13 of the inspection device 11 has succeeded. In addition, when the attraction part 15 is attracted, a force applied to the attraction part 15 has a direction perpendicular to the contact surfaces of the external connection terminals 19 and the inspection terminals 13, and no force is applied in the horizontal direction. Therefore, positional displacement is unlikely to occur.

(Others)

In the above description, the inspection target device is an optical module, but may be a device other than an optical module.

In the above description, the shapes of the inspection terminals 13 are the same as the shapes of the external connection terminals 19, but need not be the same as long as the inspection terminals 13 can contact with the external connection terminals 19 and electric connection is obtained so as to allow measurement of predetermined electric characteristics.

In FIG. 1 and FIG. 2B, the number of the vacuum attraction holes 14 is the same as the number of the first through holes 20. However, it is not necessary that all the through holes formed in the flexible substrate 17 correspond to the vacuum attraction holes 14. In a case where there is a through hole that does not correspond to the vacuum attraction hole 14, the attraction part 15 may cover only the first through holes 20 corresponding to the vacuum attraction holes 14.

In the above description, the attraction part 15 is placed on the flexible substrate 17 after the flexible substrate 17 is placed on the inspection device 11. However, the attraction part 15 and the flexible substrate 17 may be placed on the inspection device 11 after the attraction part 15 is placed on the flexible substrate 17.

In the above description, the inspection terminals 13 are formed on the front surface of the inspection base 12, but the formation surface is not limited thereto. For example, the inspection terminals 13 may be formed on the back surface of the inspection base 12. In this case, position alignment of the flexible substrate 17 is performed on the lower side of the inspection terminals 13, the attraction part 15 is placed under the flexible substrate 17, and then the attraction part 15 is attracted by vacuum attraction. The mass of the attraction part 15 is set to such a level that the attraction part 15 does not drop by its own weight.

Embodiment 2

(Structure)

Figure 4:
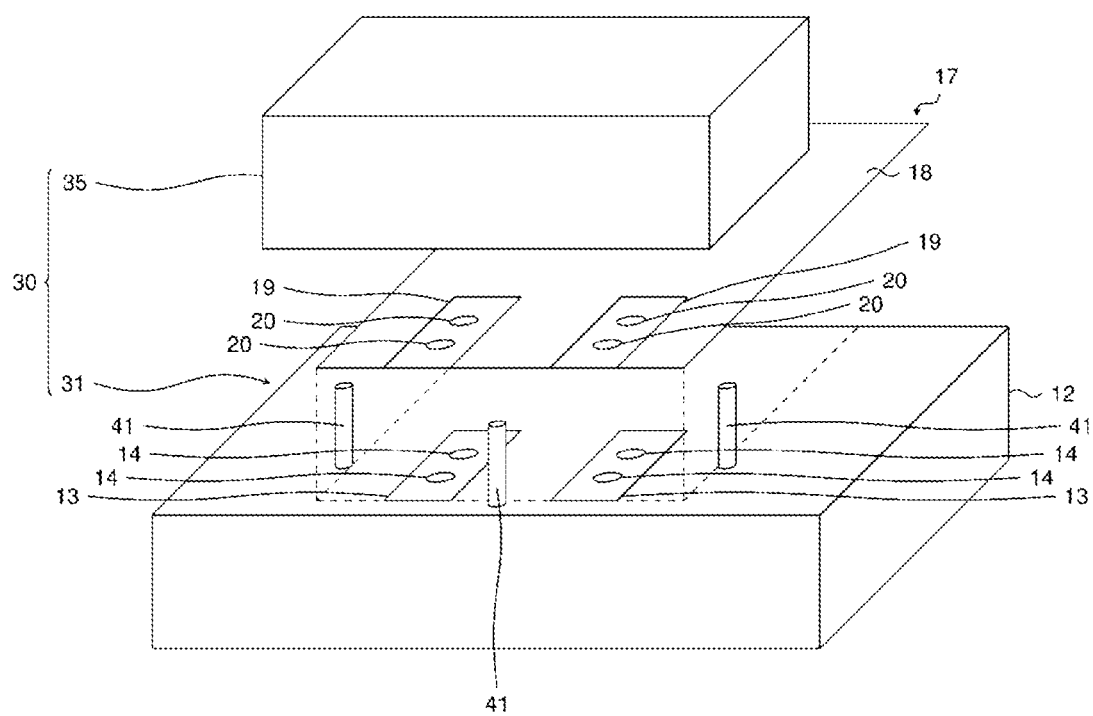
FIG. 4 is a perspective view showing an inspection jig and a flexible substrate according to embodiment 2.
Figure 5A:
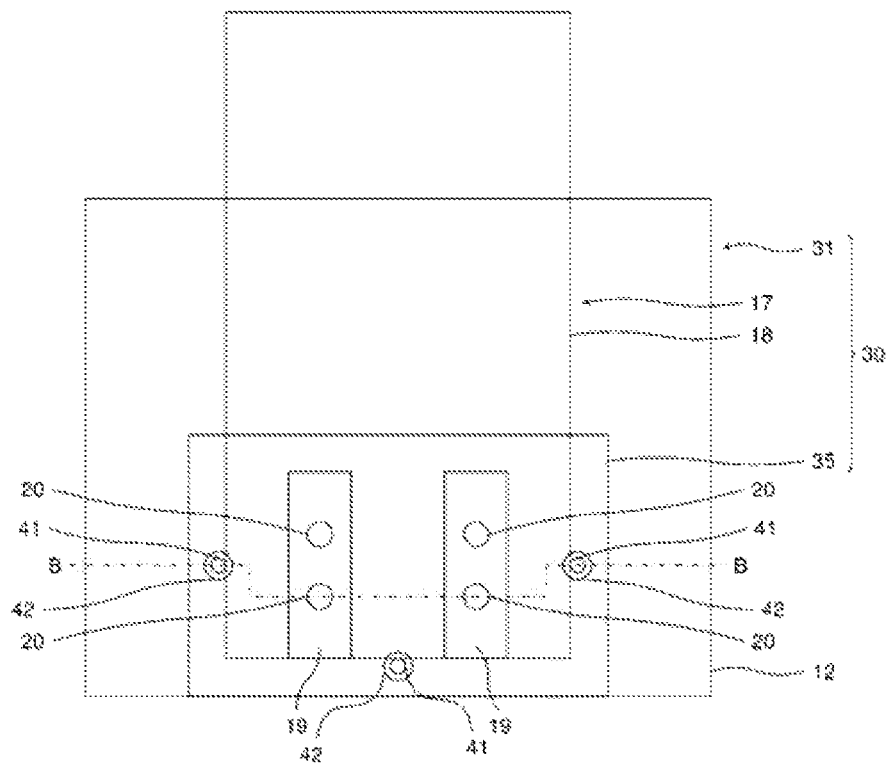
FIG. 5A is a top view showing the inspection jig and the flexible substrate according to embodiment 2.
Figure 5B:
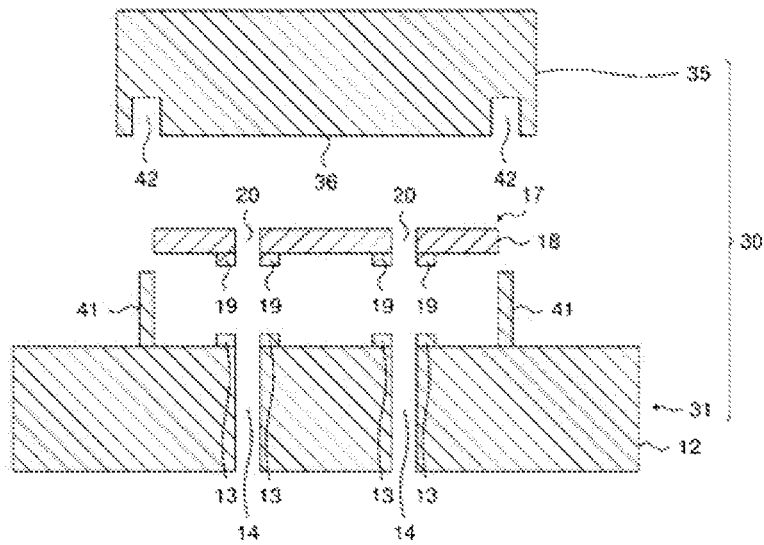
FIG. 5B is a sectional view showing the inspection jig and the flexible substrate according to embodiment 2.

The structure of an inspection jig according to embodiment 2 of the present invention will be described. FIG. 4 shows an inspection jig 30 and the flexible substrate 17 according to embodiment 2. FIG. 5A is a view as seen from above in FIG. 4, and FIG. 5B is a sectional view along line B-B in FIG. 5A. The inspection jig 30 is similar to the inspection jig 10 according to embodiment 1, but is different in that first guide portions 41 extend from the front surface of the inspection base 12.

The first guide portions 41 are formed on the surface of the inspection base 12 on which the inspection terminals 13 are formed. The first guide portions 41 are pin-shaped projections, and are formed at positions along the outer periphery of the flexible substrate 17 to be placed in inspection. That is, the first guide portions 41 are located on the outer side of the outer periphery of the flexible substrate 17 and are formed so that a part of the outer periphery of each first guide portion 41 comes into contact with the outer periphery of the flexible substrate 17. Here, a state in which a part of the outer periphery of each first guide portion 41 comes into contact with the outer periphery of the flexible substrate 17 does not mean that both outer peripheries necessarily contact with each other, and there may be a gap between both outer peripheries as long as position alignment guided by the guide portions 41 can be achieved with desired accuracy. In a case where the first guide portions 41 interfere with the attraction part 35, the attraction part 35 may have interference avoiding holes 42 for avoiding the interference.

(Inspection Method)

An inspection method using the inspection jig according to embodiment 2 will be described. The inspection method in embodiment 2 is similar to that in embodiment 1, but is different in that the flexible substrate 17 is guided by the first guide portions 41 when the flexible substrate 17 is placed on the inspection device 31.

Figure 6A:
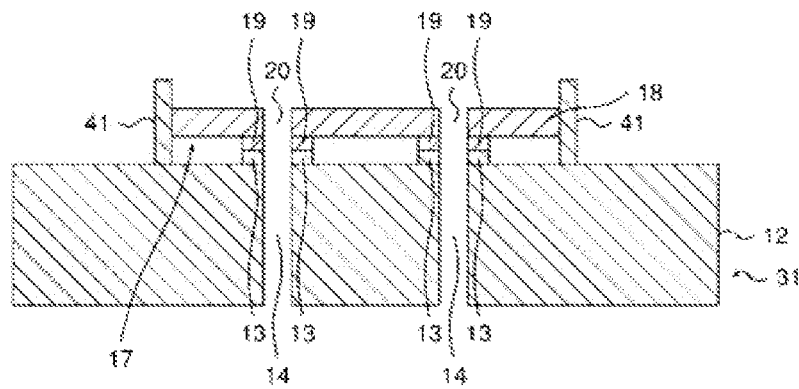
FIG. 6A is a sectional view illustrating an inspection method using the inspection jig according to embodiment 2.
Figure 6B:
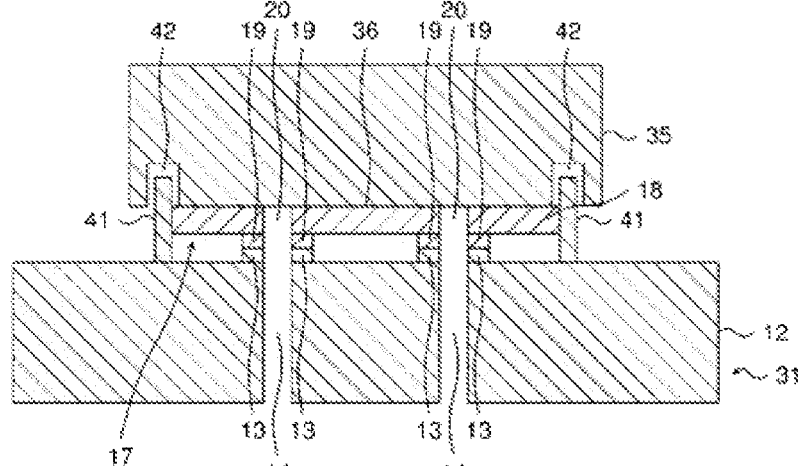
FIG. 6B is a sectional view illustrating an inspection method using the inspection jig according to embodiment 2.
Figure 6C:
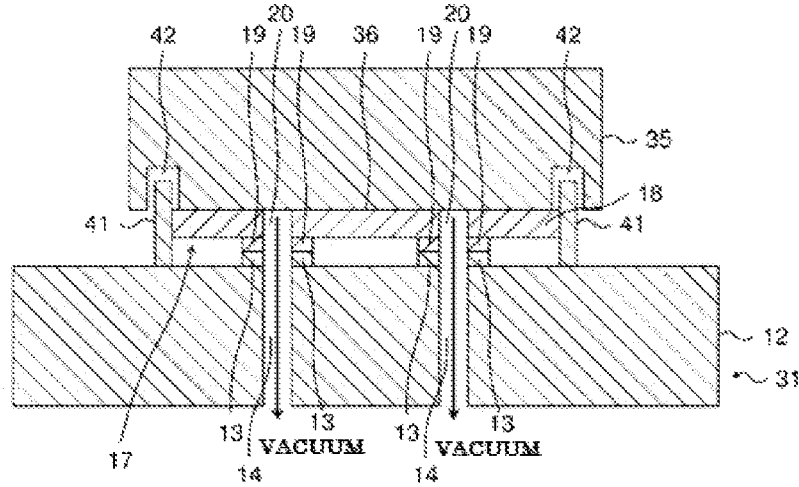
FIG. 6C is a sectional view illustrating an inspection method using the inspection jig according to embodiment 2.

First, as shown in FIG. 6A, the positions of the inspection terminals 13 of the inspection device 31 and the external connection terminals 19 of the flexible substrate 17 are aligned with each other. At this time, the flexible substrate 17 is guided by the first guide portions 41 so that the position alignment is performed. Next, as shown in FIG. 6B, the attraction part 35 is placed on the front surface of the flexible base material 18. At this time, in a case where the attraction part 35 has the interference avoiding holes 42, the first guide portions 41 are fitted into the interference avoiding holes 42. Next, as shown in FIG. 6C, the insides of the vacuum attraction holes 14 and the first through holes 20 are made into vacuum. Next, the attraction part 35 is pressed in the horizontal direction or pulled upward, to confirm whether or not the attraction part 35 is attracted, and thus whether or not the position alignment has succeeded is determined. However, in the case where the attraction part 35 has the interference avoiding holes 42, the attraction part 35 is not pressed in the horizontal direction but is pulled upward to confirm the attraction degree.

(Effects)

As described above, according to embodiment 2, since the first guide portions 41 are provided, it becomes easy to align the positions of the external connection terminals 19 of the flexible substrate 17 and the inspection terminals 13 of the inspection device 31. However, since failure of the position alignment can occur, the effect that whether or not the position alignment has succeeded can be easily determined is obtained as in embodiment 1.

(Others)

In FIG. 4 and FIG. 5B, one first guide portion 41 is provided at each of the left and the right of the flexible substrate 17, and one first guide portion 41 is provided on an end side of the flexible substrate 17. However, the provided locations and the number of the guide portions 41 are not limited thereto.

In the above description, the first guide portions 41 are pin-shaped projections, but are not limited to the pin shape. For example, a block shape or a wall shape may be employed. The same applies to a second guide portion 43.

Figure 7:
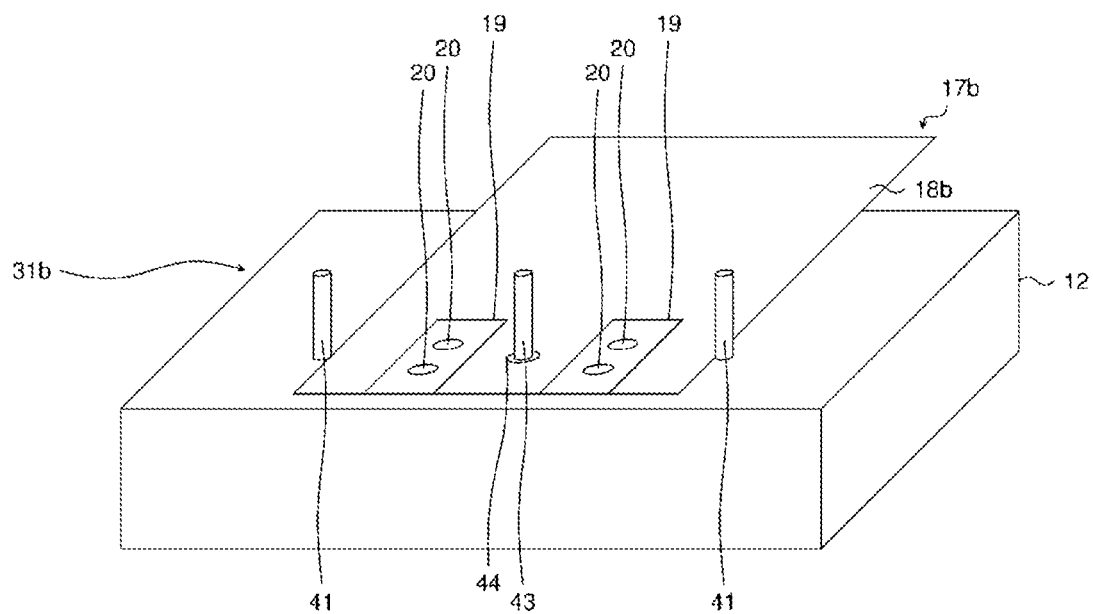
FIG. 7 is a perspective view showing a modification of the inspection jig and the flexible substrate according to embodiment 2.

As shown in FIG. 7, a flexible base material 18b may have a second through hole 44, and the inspection base 12 may have the second guide portion 43 which is a pin-shaped projection. In this case, the second through hole 44 is formed at a location where the external connection terminals 19 are not formed in the flexible base material 18b. The second guide portion 43 is formed at a position corresponding to the second through hole 44 on the surface of the inspection base 12 on which the inspection terminals 13 are formed, so that the second guide portion 43 can be inserted into the second through hole 44. The diameters of the second guide portion 43 and the second through hole 44 may be determined as appropriate in consideration of ease of handling and position alignment accuracy in inspection. Although not shown, a hole for avoiding the second guide portion 43 is formed in the attraction part. Only the second guide portion 43 may be provided without providing the first guide portions 41. A plurality of second guide portions 43 and a plurality of second through holes may be provided.

Embodiment 3

(Structure)

Figure 8:
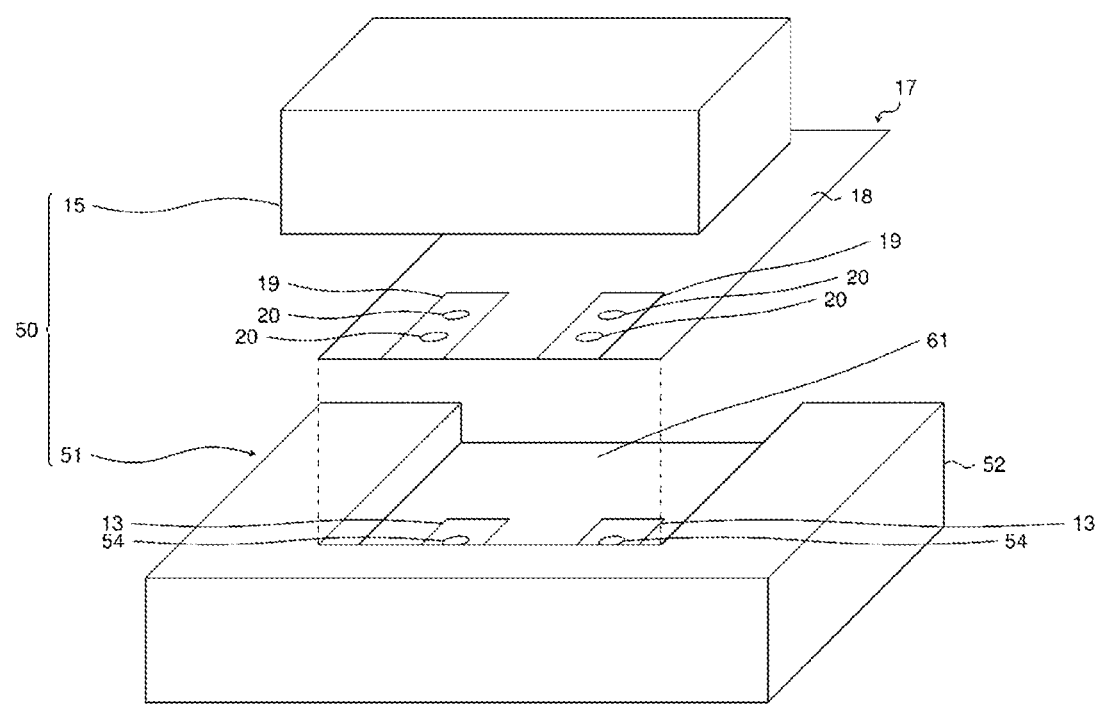
FIG. 8 is a perspective view showing an inspection jig and a flexible substrate according to embodiment 3.
Figure 9A:
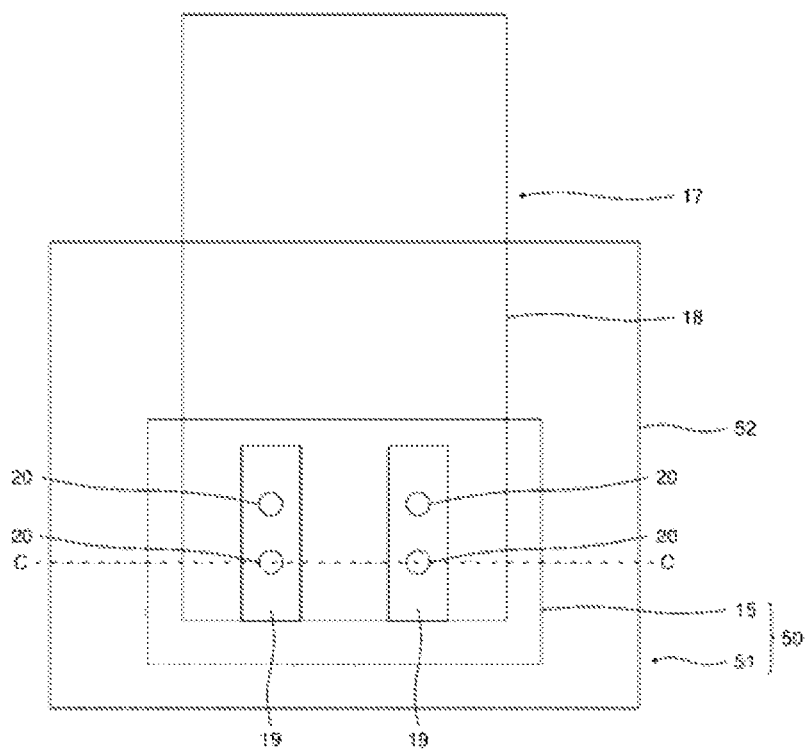
FIG. 9A is a top view showing the inspection jig and the flexible substrate according to embodiment 3.
Figure 9B:
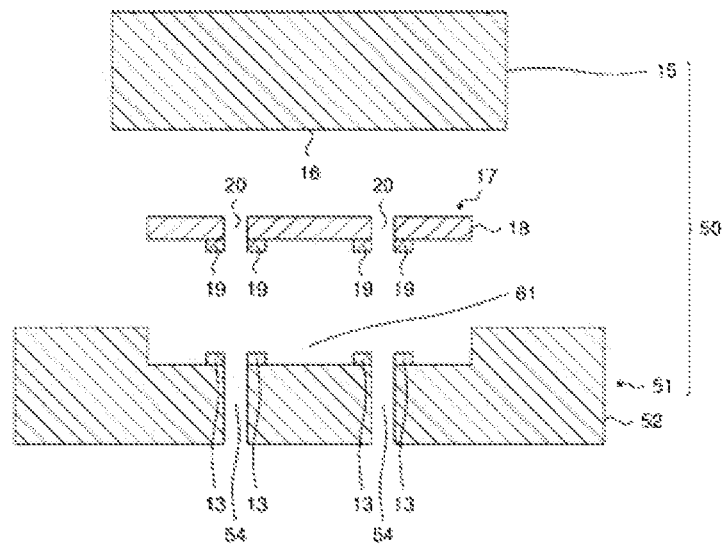
FIG. 9B is a sectional view showing the inspection jig and the flexible substrate according to embodiment 3.

The structure of an inspection jig according to embodiment 3 of the present invention will be described. FIG. 8 shows an inspection jig 50 and the flexible substrate 17 according to embodiment 3. FIG. 9A is a view as seen from above in FIG. 8, and FIG. 9B is a sectional view along line C-C in FIG. 9A. The inspection jig 50 is similar to the inspection jig 10 according to embodiment 1, but is different in that a first recess 61 is provided on the front surface of an inspection base 52.

The first recess 61 is recessed along the shape of the outer periphery of the flexible substrate 17 to be placed in inspection. The inspection terminals 13 are formed at the bottom of the first recess 61. The depth of the first recess 61 is smaller than the sum of the thicknesses of the flexible base material 18, the external connection terminal 19, and the inspection terminal 13, so that the attraction part 15 does not interfere with the inspection base 52 in inspection.

(Inspection Method)

An inspection method using the inspection jig according to embodiment 3 will be described. The inspection method in embodiment 3 is similar to that in embodiment 1, but is different in that the flexible substrate 17 is guided by the first recess 61 when the flexible substrate 17 is placed on the inspection device 51.

Figure 10A:
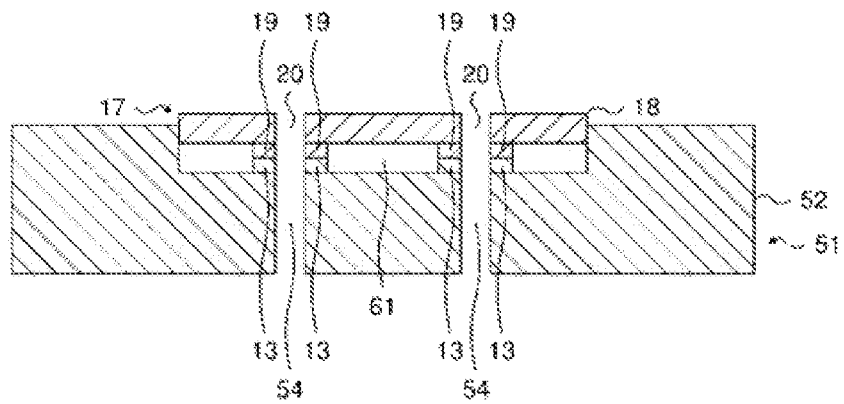
FIG. 10A is a sectional view illustrating an inspection method using the inspection jig according to embodiment 3.
Figure 10B:
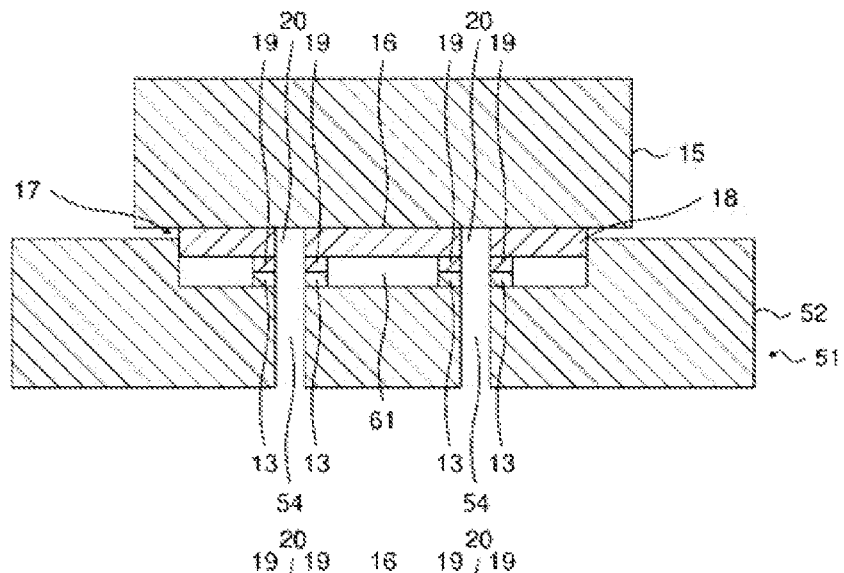
FIG. 10B is a sectional view illustrating an inspection method using the inspection jig according to embodiment 3.
Figure 10C:
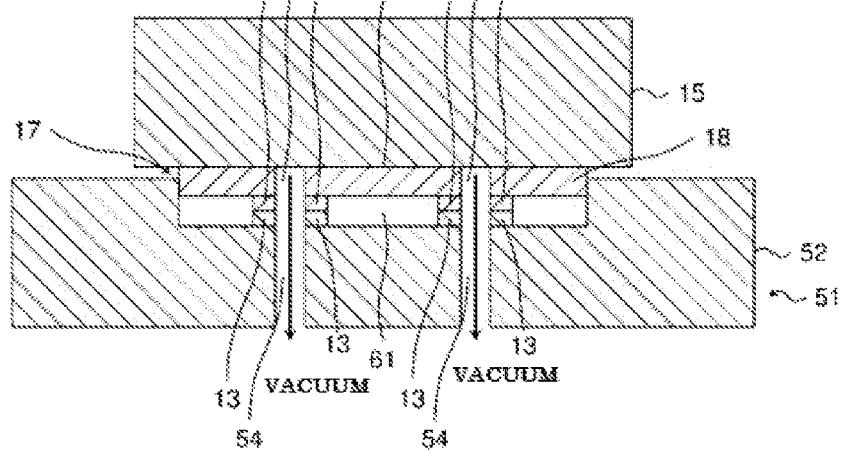
FIG. 10C is a sectional view illustrating an inspection method using the inspection jig according to embodiment 3.

First, as shown in FIG. 10A, the positions of the inspection terminals 13 of the inspection device 51 and the external connection terminals 19 of the flexible substrate 17 are aligned with each other. At this time, the flexible substrate 17 is guided by the first recess 61 so that the position alignment is performed. Next, as shown in FIG. 10B, the attraction part 15 is placed on the front surface of the flexible base material 18. Next, as shown in FIG. 10C, the insides of vacuum attraction holes 54 and the first through holes 20 are made into vacuum. Next, whether or not the attraction part 15 is attracted is confirmed, thus determining whether or not the position alignment has succeeded.

(Effects)

As described above, according to embodiment 3, since the first recess 61 is provided, it becomes easy to align the positions of the external connection terminals 19 of the flexible substrate 17 and the inspection terminals 13 of the inspection device 51. However, since failure of the position alignment can occur, the effect that whether or not the position alignment has succeeded can be easily determined is obtained as in embodiment 1.

Embodiment 4

(Structure)

Figure 11A:
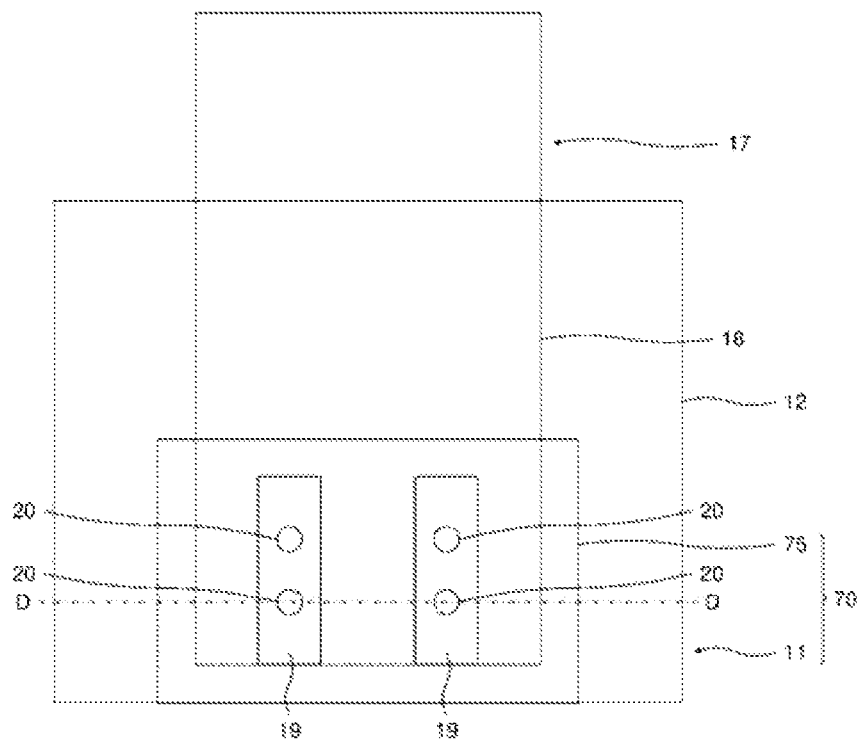
FIG. 11A is a top view showing an inspection jig and a flexible substrate according to embodiment 4.
Figure 11B:
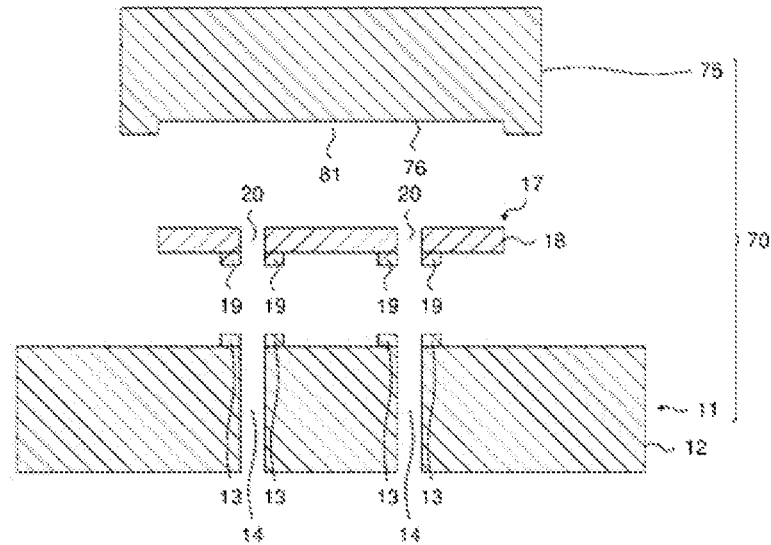
FIG. 11B is a sectional view showing an inspection jig and a flexible substrate according to embodiment 4.

The structure of an inspection jig according to embodiment 4 of the present invention will be described. FIG. 11A is a view of an inspection jig 70 and the flexible substrate 17 according to embodiment 4, as seen from above, and FIG. 11B is a sectional view along line D-D in FIG. 11A. The inspection jig 70 is similar to the inspection jig 10 according to embodiment 1, but is different in that the attraction part 75 has a second recess 81 and further the attraction part 75 is linked with the inspection device 11 by a linkage mechanism (not shown).

Figure 12:
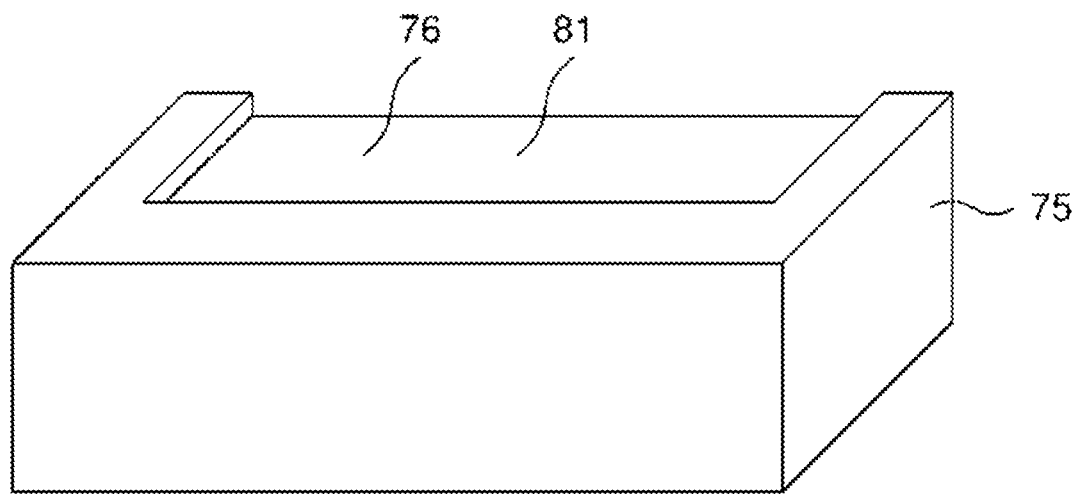
FIG. 12 is a perspective view showing an attraction part according to embodiment 4.

The attraction part 75 has the second recess 81 as shown in FIG. 12. FIG. 12 shows the attraction part 75 upside down for convenience of description. The second recess 81 is recessed along the shape of the outer periphery of the flexible substrate 17 to be placed in inspection. The depth of the second recess 81 is smaller than the sum of the thicknesses of the flexible base material 18, the external connection terminal 19, and the inspection terminal 13, so that the attraction part 75 does not interfere with the inspection base 12 in inspection. The bottom of the second recess 81 serves as an attraction surface 76.

The attraction part 75 is linked with the inspection device 11 by the linkage mechanism such that the attraction part 75 can move in directions to become close to and away from the inspection terminal 13. This linkage is configured such that, when the attraction part 75 moves together with the inspection target device by the linkage mechanism in the direction to become close to the inspection device 11, the positions of the external connection terminals 19 and the inspection terminals 13 are aligned with each other.

(Inspection Method)

An inspection method using the inspection jig according to embodiment 4 will be described. The inspection method in embodiment 4 is similar to that in embodiment 1, but is different in that, before the flexible substrate 17 is placed on the inspection device 11, the flexible substrate 17 is set in the second recess 81, and then the attraction part 75 and the flexible substrate 17 are brought close to the inspection terminals 13, thereby performing position alignment.

Figure 13A:
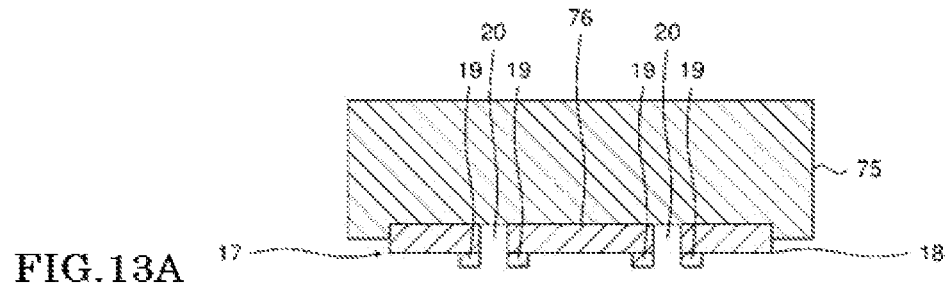
FIG. 13A is a sectional view illustrating an inspection method using the inspection jig according to embodiment 4.
Figure 13B:
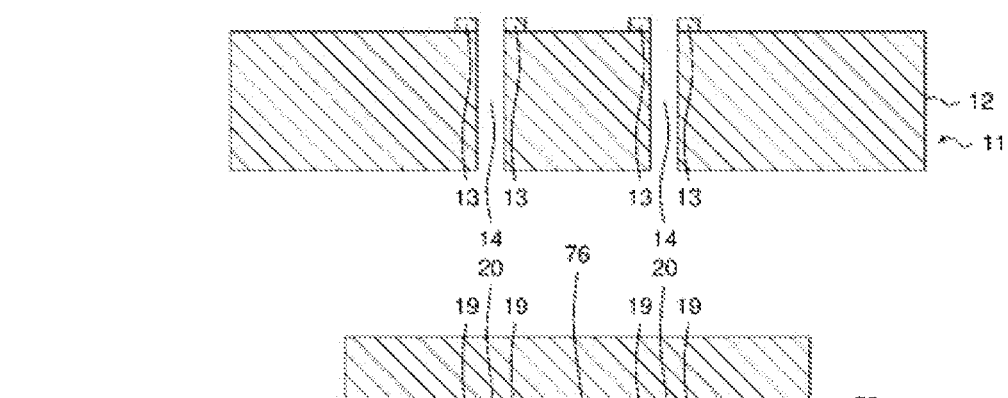
FIG. 13B is a sectional view illustrating an inspection method using the inspection jig according to embodiment 4.
Figure 13C:
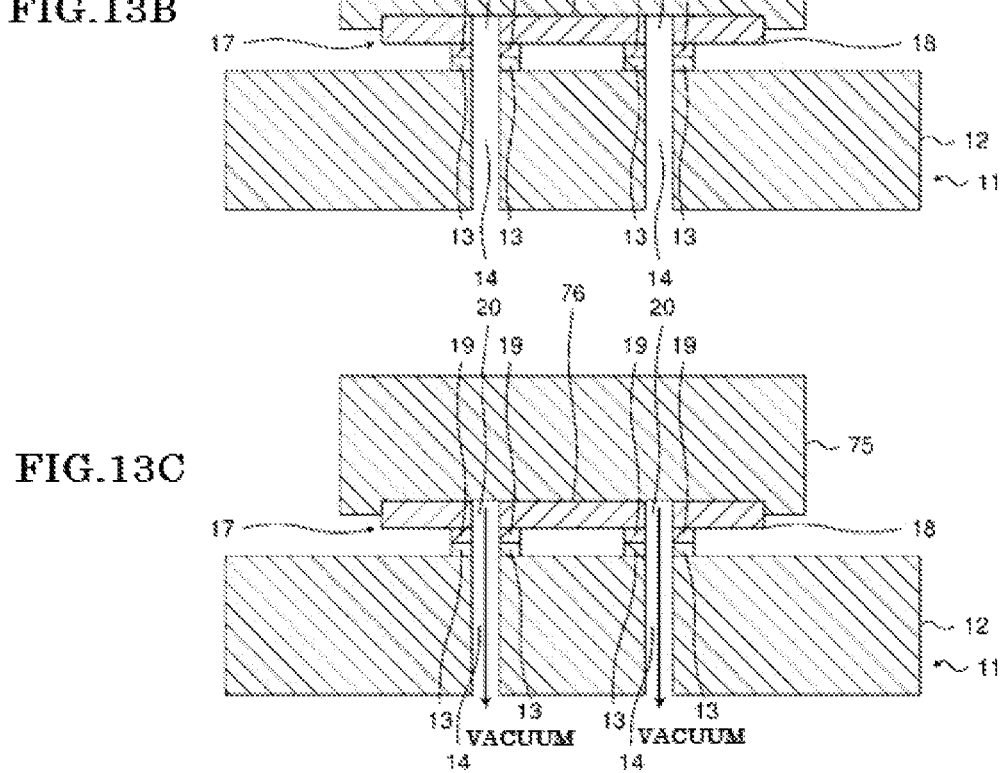
FIG. 13C is a sectional view illustrating an inspection method using the inspection jig according to embodiment 4.

First, as shown in FIG. 13A, the optical module is placed so that the flexible substrate 17 is fitted into the second recess 81. Next, as shown in FIG. 13B, the attraction part 75 and the flexible substrate 17 are integrally moved by the linkage mechanism in a direction to become close to the inspection terminal 13. Thus, the positions of the external connection terminals 19 and the inspection terminals 13 are aligned, so that the external connection terminals 19 and the inspection terminals 13 come into face-to-face contact with each other, and the first through holes 20 and the vacuum attraction holes 14 overlap each other. Next, as shown in FIG. 13C, the insides of the first through holes 20 and the vacuum attraction holes 14 are made into vacuum. Next, whether or not the attraction part 75 is attracted is confirmed, thus determining whether or not the position alignment has succeeded.

(Effects)

As described above, according to embodiment 4, since the second recess 81 is provided and the attraction part 75 and the inspection device 11 are linked with each other so that the positions of the external connection terminals 19 and the inspection terminals 13 are aligned, it becomes easy to align the positions of the external connection terminals 19 of the flexible substrate 17 and the inspection terminals 13 of the inspection device 11. However, since failure of the position alignment can occur, the effect that whether or not the position alignment has succeeded can be easily determined is obtained as in embodiment 1.

(Others)

Figure 14A:
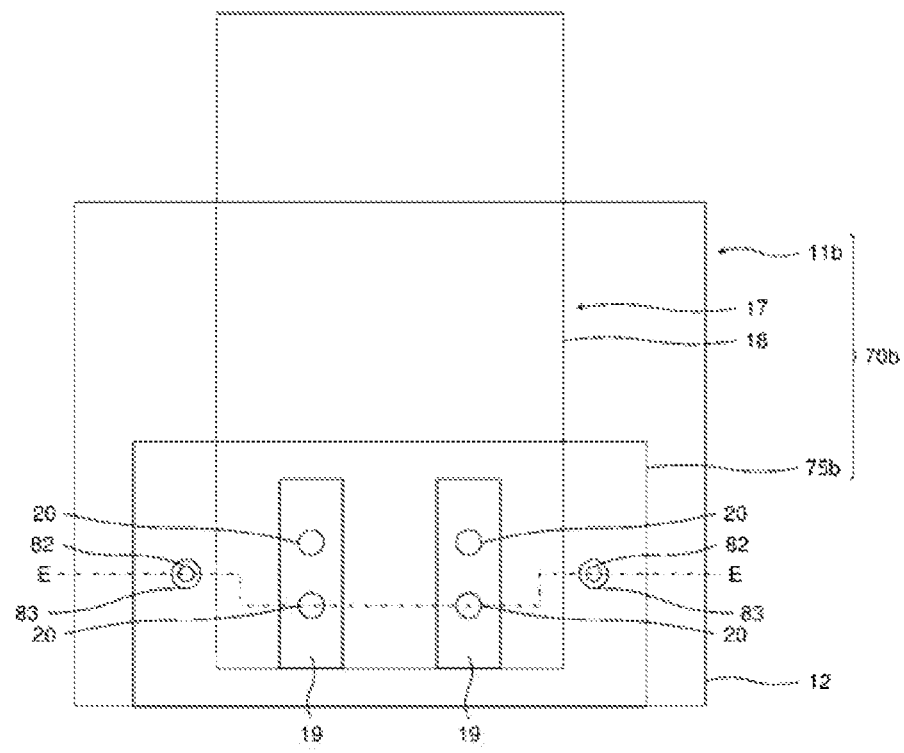
FIG. 14A is a top view showing a modification of the inspection jig and the flexible substrate according to embodiment 4.
Figure 14B:
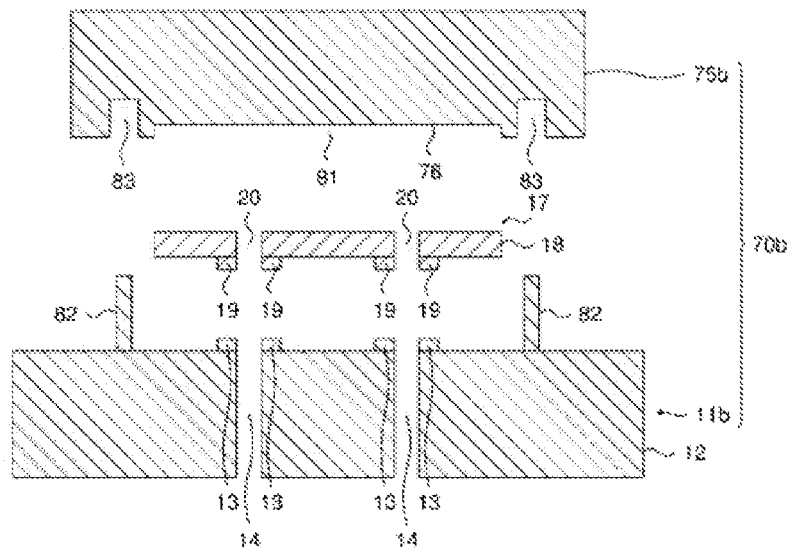
FIG. 14B is a sectional view showing a modification of the inspection jig and the flexible substrate according to embodiment 4.

An inspection device 11b may have third guide portions 82 which are pin-shaped projections, and an attraction part 75b may have guide holes 83, so that the third guide portions 82 may be inserted into the guide holes 83 in inspection. FIG. 14A is a view of an inspection jig 70b and the flexible substrate 17 in this modification as seen from above, and FIG. 14B is a sectional view along line E-E in FIG. 14A. As shown in FIG. 14A and FIG. 14B, on the surface of the inspection device 11b on which the inspection terminals 13 are formed, the third guide portions 82 are formed on the outer side of the flexible substrate 17 to be placed in inspection, and the attraction part 75b has, at positions corresponding to the third guide portions 82, the guide holes 83 into which the third guide portions 82 can be inserted. The diameters of the third guide portions 82 and the guide holes 83 may be determined as appropriate in consideration of ease of handling and position alignment accuracy in inspection. In addition, the attraction part 75b may not necessarily be linked with the inspection device 11b. Even if they are not linked, position alignment can be easily performed by the third guide portions 82 being fitted into the guide holes 83. The third guide portions 82 may not necessarily be pin-shaped projections, and may have a block shape or a wall shape, for example.

DESCRIPTION OF THE REFERENCE CHARACTERS

10, 30, 30b, 50, 70, 70b inspection jig
11, 31, 31b, 51 inspection device
12, 52 inspection base
13 inspection terminal
14, 54 vacuum attraction hole
15, 35, 75, 75b attraction part
16, 36, 76 attraction surface
17, 17b flexible substrate
18, 18b flexible base material
19 external connection terminal
20 first through hole
41 first guide portion
43 second guide portion
44 second through hole
61 first recess
81 second recess
82 third guide portion
83 guide hole

The invention claimed is:

1. An inspection jig used for inspection for an inspection target device including a flexible substrate having a flexible base material and an external connection terminal formed on a back surface of the flexible base material, the inspection jig comprising:
    an inspection device having an inspection base and an inspection terminal formed on the inspection base; and
    an attraction part having an attraction surface, wherein
    the external connection terminal has a first through hole penetrating therein and also through the flexible base material,
    the inspection terminal has a vacuum attraction hole at a position corresponding to the first through hole of the flexible substrate to be placed in the inspection, and
    in the inspection, the inspection target device is placed so that the external connection terminal and the inspection terminal are face-to-face with each other and the first through hole and the vacuum attraction hole overlap each other, the attraction part is placed on a front surface of the flexible base material so that the attraction surface covers the first through hole, and insides of the first through hole and the vacuum attraction hole are made into vacuum, whereby the attraction surface is attracted to the flexible base material and the external connection terminal is attracted to the inspection terminal.

2. The inspection jig according to claim 1, wherein
on a surface of the inspection base on which the inspection terminal is formed, a first guide portion is formed at a position along an outer periphery of the flexible substrate to be placed in the inspection.

3. The inspection jig according to claim 1, wherein
the flexible base material has a second through hole at a location where the external connection terminal is not formed, and
on a surface of the inspection base on which the inspection terminal is formed, a second guide portion insertable into the second through hole is formed at a position corresponding to the second through hole of the flexible substrate to be placed in the inspection.

4. The inspection jig according to claim 1, wherein
the inspection base has a first recess recessed along a shape of an outer periphery of the flexible substrate to be placed in the inspection, the inspection terminal is formed at a bottom of the first recess, and a depth of the first recess is smaller than a sum of thicknesses of the flexible base material, the external connection terminal, and the inspection terminal.

5. The inspection jig according claim 1, wherein
the attraction part has a second recess recessed along a shape of an outer periphery of the flexible substrate, the attraction surface is formed at a bottom of the second recess, and a depth of the second recess is smaller than a sum of thicknesses of the flexible base material, the external connection terminal, and the inspection terminal,
the attraction part is linked with the inspection device by a linkage mechanism so as to be movable in directions to become close to and away from the inspection terminal, and in the inspection, the inspection target device is placed so that the flexible substrate is fitted into the second recess, and the attraction part is moved together with the inspection target device by the linkage mechanism in the direction to become close to the inspection terminal, whereby the external connection terminal and the inspection terminal come into face-to-face contact with each other and the first through hole and the vacuum attraction hole overlap each other.

6. The inspection jig according to claim 1, wherein
on a surface of the inspection base on which the inspection terminal is formed, a third guide portion is formed on an outer side of the flexible substrate to be placed in the inspection,
the attraction part has a second recess recessed along a shape of an outer periphery of the flexible substrate, the attraction surface is formed at a bottom of the second recess, and a depth of the second recess is smaller than a sum of thicknesses of the flexible base material, the external connection terminal, and the inspection terminal,
the attraction part further has a guide hole, and
in the inspection, the inspection target device is placed so that the flexible substrate is fitted into the second recess, and the attraction part is moved together with the inspection target device in a direction to become close to the inspection terminal, so as to insert the third guide portion into the guide hole, whereby the external connection terminal and the inspection terminal come into face-to-face contact with each other and the first through hole and the vacuum attraction hole overlap each other.

7. The inspection jig according to claim 2, wherein
the flexible base material has a second through hole at a location where the external connection terminal is not formed, and
on the surface of the inspection base on which the inspection terminal is formed, a second guide portion insertable into the second through hole is formed at a position corresponding to the second through hole of the flexible substrate to be placed in the inspection.

8. The inspection jig according to claim 2, wherein
the inspection base has a first recess recessed along a shape of the outer periphery of the flexible substrate to be placed in the inspection, the inspection terminal is formed at a bottom of the first recess, and a depth of the first recess is smaller than a sum of thicknesses of the flexible base material, the external connection terminal, and the inspection terminal.

9. The inspection jig according to claim 2, wherein
the attraction part has a second recess recessed along a shape of the outer periphery of the flexible substrate, the attraction surface is formed at a bottom of the second recess, and a depth of the second recess is smaller than a sum of thicknesses of the flexible base material, the external connection terminal, and the inspection terminal,
the attraction part is linked with the inspection device by a linkage mechanism so as to be movable in directions to become close to and away from the inspection terminal, and
in the inspection, the inspection target device is placed so that the flexible substrate is fitted into the second recess, and the attraction part is moved together with the inspection target device by the linkage mechanism in the direction to become close to the inspection terminal, whereby the external connection terminal and the inspection terminal come into face-to-face contact with each other and the first through hole and the vacuum attraction hole overlap each other.

10. The inspection jig according to claim 2, wherein
on the surface of the inspection base on which the inspection terminal is formed, a third guide portion is formed on an outer side of the flexible substrate to be placed in the inspection,
the attraction part has a second recess recessed along a shape of the outer periphery of the flexible substrate, the attraction surface is formed at a bottom of the second recess, and a depth of the second recess is smaller than a sum of thicknesses of the flexible base material, the external connection terminal, and the inspection terminal,
the attraction part further has a guide hole, and
in the inspection, the inspection target device is placed so that the flexible substrate is fitted into the second recess, and the attraction part is moved together with the inspection target device in a direction to become close to the inspection terminal, so as to insert the third guide portion into the guide hole, whereby the external connection terminal and the inspection terminal come into face-to-face contact with each other and the first through hole and the vacuum attraction hole overlap each other.

11. The inspection jig according to claim 7, wherein
the inspection base has a first recess recessed along a shape of the outer periphery of the flexible substrate to be placed in the inspection, the inspection terminal is formed at a bottom of the first recess, and a depth of the first recess is smaller than a sum of thicknesses of the flexible base material, the external connection terminal, and the inspection terminal.

12. The inspection jig according to claim 7, wherein
the attraction part has a second recess recessed along a shape of the outer periphery of the flexible substrate, the attraction surface is formed at a bottom of the second recess, and a depth of the second recess is smaller than a sum of thicknesses of the flexible base material, the external connection terminal, and the inspection terminal,
the attraction part is linked with the inspection device by a linkage mechanism so as to be movable in directions to become close to and away from the inspection terminal, and
in the inspection, the inspection target device is placed so that the flexible substrate is fitted into the second recess, and the attraction part is moved together with the inspection target device by the linkage mechanism in the direction to become close to the inspection terminal, whereby the external connection terminal and the inspection terminal come into face-to-face contact with each other and the first through hole and the vacuum attraction hole overlap each other.

13. The inspection jig according to claim 7, wherein
on the surface of the inspection base on which the inspection terminal is formed, a third guide portion is formed on an outer side of the flexible substrate to be placed in the inspection,
the attraction part has a second recess recessed along a shape of the outer periphery of the flexible substrate, the attraction surface is formed at a bottom of the second recess, and a depth of the second recess is smaller than a sum of thicknesses of the flexible base material, the external connection terminal, and the inspection terminal, the attraction part further has a guide hole, and in the inspection, the inspection target device is placed so that the flexible substrate is fitted into the second recess, and the attraction part is moved together with the inspection target device in a direction to become close to the inspection terminal, so as to insert the third guide portion into the guide hole, whereby the external connection terminal and the inspection terminal come into face-to-face contact with each other and the first through hole and the vacuum attraction hole overlap each other.

* * * * *